United States Patent [19]

Saba et al.

[11] 4,290,145
[45] Sep. 15, 1981

[54] CIRCUIT ARRANGEMENT FOR COMPENSATING TEMPERATURE-DEPENDENT FREQUENCY VARIATIONS OF A CRYSTAL-CONTROLLED OSCILLATOR

[75] Inventors: Manlio Saba; Roberto Szocs, both of Milan, Italy

[73] Assignee: Società Italiana Telecomunicazioni Siemens S.p.A., Milan, Italy

[21] Appl. No.: 158,509

[22] Filed: Jun. 11, 1980

[30] Foreign Application Priority Data

Jun. 12, 1979 [IT] Italy ............................. 23479 A/79

[51] Int. Cl.³ ........................................... H04B 1/04
[52] U.S. Cl. ................................... 455/113; 332/18; 455/118; 455/119
[58] Field of Search ............... 455/42, 45, 102, 110, 455/113, 117, 118, 119; 331/66, 176; 332/18, 22

[56] References Cited

U.S. PATENT DOCUMENTS

| 3,360,746 | 12/1967 | Weidknecht | 331/176 |
| 3,531,739 | 9/1970 | Groves | 331/176 |
| 3,534,295 | 10/1970 | Gregory | 455/119 |
| 3,550,006 | 12/1970 | Harner | 455/119 |
| 3,821,665 | 6/1974 | Irwin et al. | 331/66 |

Primary Examiner—Marc E. Bookbinder
Attorney, Agent, or Firm—Karl F. Ross

[57] ABSTRACT

A subcarrier frequency-modulated with a message signal is heterodyned with a carrier from a crystal-controlled oscillator in a mixer whose output is fed to a filter eliminating one of the resulting sidebands. In order to compensate temperature-dependent fluctuations of the carrier frequency, a function generator produces a corrective signal which is added to the message signal in the input of the frequency modulator traversed by the subcarrier. The corrective signal varies as a quadratic or a cubic function of temperature, depending upon the type of cut used on the quartz crystal controlling the carrier oscillator, with a polarity determined by which of the two sidebands is passed by the filter.

7 Claims, 4 Drawing Figures

CIRCUIT ARRANGEMENT FOR COMPENSATING TEMPERATURE-DEPENDENT FREQUENCY VARIATIONS OF A CRYSTAL-CONTROLLED OSCILLATOR

FIELD OF THE INVENTION

Our present invention relates to a circuit arrangement for compensating temperature-dependent frequency variations of an oscillator of the crystal-controlled type which generates a carrier for the transmission of messages by frequency modulation.

BACKGROUND OF THE INVENTION

For the compensation of carrier-frequency fluctuations due to changes in ambient temperature it is customary to use a resistance network including one or more thermistors disposed in the vicinity of the oscillator so as to sense the temperature changes affecting the quartz crystal which acts as a frequency-controlling element thereof. A corrective voltage emitted by the resistance network is fed to an adjustable impedance, such as a varactor, in circuit with that crystal to counteract the thermal fluctuations in carrier frequency. For a reasonably precise compensation it is necessary to use relatively expensive thermistors with tolerance limits substantially less than those of ordinary thermistors whose resistances at a given temperature may deviate by as much as ±5% from the rated value.

OBJECTS OF THE INVENTION

The general object of our present invention is to provide an improved circuit arrangement for the stabilization of a carrier frequency, subject to modulation by a message signal, which can be realized with relatively inexpensive components and can be mass-produced with satisfactory performance despite unavoidable manufacturing tolerances.

Another object is to provide means in such a circuit arrangement enabling its convenient adaptation to different types of cut of a frequency-controlling crystal.

A further object is to facilitate the utilization of a frequency-stabilized carrier for selective message transmission in either of two frequency bands.

SUMMARY OF THE INVENTION

In accordance with our present invention we provide a frequency modulator receiving on a first input a subcarrier and on a second input a message signal to be modulated upon that subcarrier. A function generator, disposed in the vicinity of a crystal-controlled oscillator whose temperature-dependent frequency fluctuations are to be compensated, emits a corrective signal of a magnitude which varies as a function of temperature related to these fluctuations. The message signal is fed to the second modulator input together with the corrective signal with the aid of a summing circuit connected to the function generator and to the message-signal source; thus, the subcarrier is frequency-modulated by the sum of the message and corrective signals. A mixer with input connections to the crystal-controlled oscillator and to the modulator heterodynes a carrier, generated by that oscillator, with the frequency-modulated subcarrier to produce a pair of sidebands respectively representing the sum and the difference of the carrier and the subcarrier; in one of these sidebands the carrier-frequency fluctuations are substantially compensated by the corrective modulation of the subcarrier, this sideband being passed by a filter disposed downstream of the mixer.

With the absolute magnitude of the corrective signal varying substantially in proportion to the thermally induced fluctuations of the carrier frequency, the choice of the sideband depends on the polarity of the corrective signal which either increments or decrements the frequency of the subcarrier. In the absence of a message signal, the upper sideband will have a constant frequency if an increase in carrier frequency is compensated by a decrease in subcarrier frequency and vice versa; to stabilize the frequency of the lower sideband, the frequencies of the carrier and the subcarrier must vary in the same sense.

Since the frequency of the carrier will generally be much higher than that of the subcarrier, the latter will have to undergo substantially larger excursions to balance the thermal fluctuations of the carrier frequency. Thus, minor percentual variations in the subcarrier frequency due to thermistor tolerances, for example, will have only a negligible effect upon the transmitted carrier frequency.

We have found that the frequency/temperature response of quartz crystals conventionally used in high-frequency oscillators follows an exponential law which can be represented, with good approximation, by a quadratic or a cubic function according to the type of cut used on the crystal. More particularly, the response of a C-cut crystal follows a square law whereas that of an AT-cut crystal corresponds to a third-order polynomial with a linear and a cubic term. The function generator provided in accordance with our present invention, therefore, advantageously includes temperature-dependent impedance means such as one or more thermistors, producing a basic signal, and multiplication means in the form of several cascaded stages emitting respective terms of a polynomial function of that basic signal, in combination with circuit means including adjustable attenuators (or possibly variable-gain amplifiers) for assigning selected coefficients to these terms and switch means enabling the selective extraction of one or more terms weighted by these coefficients to form the corrective signal. A polarity switch may also be provided to enable a selective changeover between the two sidebands as discussed above.

BIREF DESCRIPTION OF THE DRAWING

These and other features of our invention will now be described in detail with reference to the accompanying drawing in which.

SPECIFIC DESCRIPTION

Figure 1:
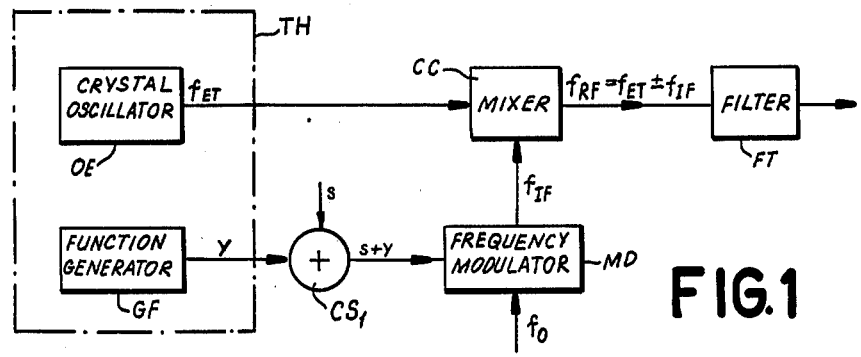
FIG. 1 is a block diagram of a message-transmitting system equipped with our frequency-stabilizing circuit arrangement.

In FIG. 1 we have shown a conventional crystal-controlled high-frequency oscillator OE emitting a carrier of frequency $f_{ET}$ subject to fluctuations due to changes in ambient temperature. Close by, within the same thermal environment as indicated by an outline TH, we provide a programmable function generator GF emitting a corrective signal y which is summed with a message signal s, e.g. a voice frequency, in an adder $CS_1$. The combined signal $s+y$ is fed to a frequency modulator MD also receiving a subcarrier of stabilized intermediate frequency $f_O$ from a nonillustrated source. The frequency-modulated subcarrier $f_{IF}$ is supplied, together with the carrier $f_{ET}$ from oscillator OE, to a mixer CC for heterodyning to produce a radio-frequency oscillation $f_{RF}$ consisting of two sidebands $f_{ET}+f_{IF}$ and $f_{ET}-f_{IF}$. This oscillation is passed through a filter FT which suppresses one or the other of the two sidebands.

Figure 2A:
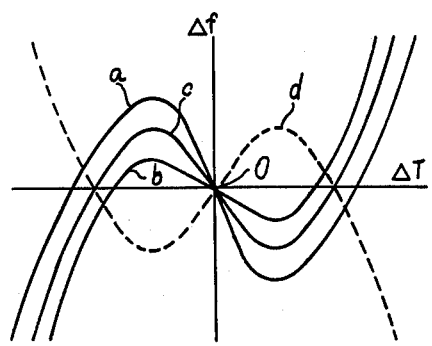
FIGS. 2A and 2B are graphs showing sets of curves relating to the temperature dependence of oscillator frequencies generated by an AT-cut crystal and a C-cut crystal, respectively.

If the oscillator OE is controlled by an AT-cut crystal, the deviations $\Delta f$ from its rated frequency will vary in the manner illustrated in FIG. 2A as a function of temperature departures $\Delta T$ from a reference level. A representative curve c, lying between two range limits a and b, is a polynomial function of the form $\Delta f = -p\Delta T + q(\Delta T)^3$. If the corrective signal y of FIG. 1 has the shape of curve c, substantial compensation of thermal frequency fluctuations will occur in the lower sideband $f_{ET}-f_{IF}$ so that filter FT can be of the low-pass type. If, however, it is desired to use the upper sideband $f_{ET}+f_{IF}$ with filter FT designed as a high pass, signal y should follow a curve d which is the image of curve c with inverted sign. All four curves a-d of FIG. 2A intersect at an operating point O representing normal temperature and frequency.

Figure 2B:
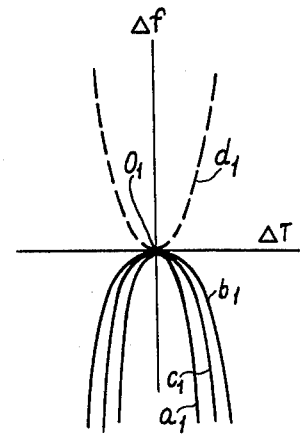

In the case of a C-cut crystal the function $\Delta f/\Delta T$ follows a square law as represented in FIG. 2B by a median curve in the form of a parabola $c_1$ lying between limiting parabolas $a_1$ and $b_1$. If a low-pass filter FT is used in FIG. 1, corrective signal y should conform to curve $c_1$; with a high-pass filter it should follow a curve $d_1$ symmetrical to parabola $c_1$. All four parabolas of FIG. 2B have a common vertex at an operating point $O_1$.

Figure 3:
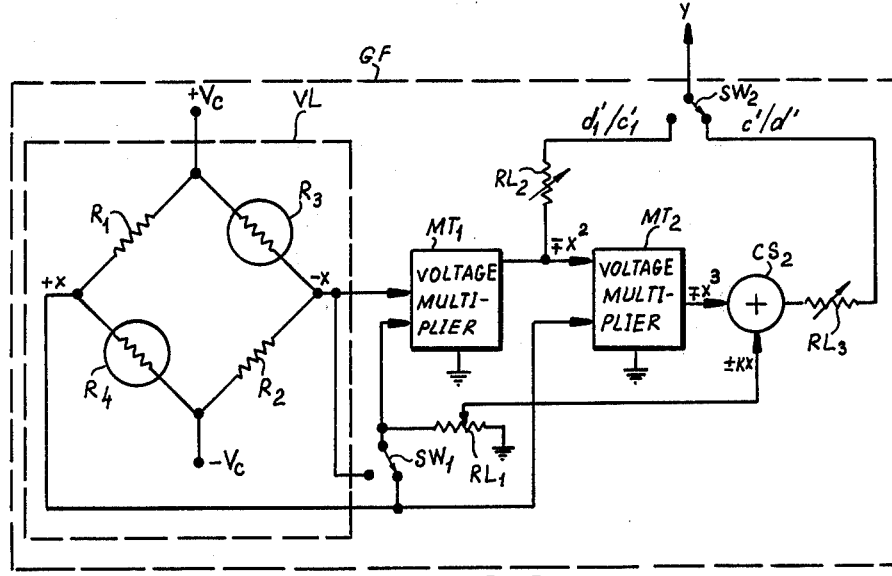
FIG. 3 shows details of a function generator included in the block diagram of FIG. 1.

In FIG. 3 we have illustrated details of the function generator GF which can be programmed to emit a corrective signal y conforming to any one of curves c, d, $c_1$ and $d_1$ discussed above, depending on the type of crystal used and the sideband selected. Function generator GF comprises a resistance bridge VL having an input diagonal connected across a supply of constant reference voltage with terminals $+V_c$ and $-V_c$, the bridge including two opposite arms formed by resistors $R_1$, $R_2$ and two other opposite arms formed by thermistors $R_3$ and $R_4$; the latter are here assumed to be of the directly heated type with positive resistance/temperature characteristic. When the bridge is in balance (with $\Delta T = 0$), no voltage difference exists across its output diagonal. In the event of an unbalance, a basic signal appears with opposite polarities at the ends of this output diagonal as indicated at $-x$ and $+x$; these signals are respectively sent to a pair of cascaded voltage-multiplier stages $MT_1$ and $MT_2$. A selector switch $SW_1$ feeds either one of these voltages to another input of first-stage multiplier $MT_1$; the latter thus emits a quadratic term $\mp x^2$ which is fed on the one hand to multiplier $MT_2$ and on the other hand to an adjustable attenuator $RL_2$. Multiplier $MT_2$ generates a cubic term $\mp x^3$ delivered to one input of an adder $CS_2$ which receives on its other input a fractional value $\pm kx$ of the basic signal derived from a potentiometer $RL_1$ inserted between ground and switch $SW_1$. The output of adder $CS_2$ thus represents the algebraic sum of the linear term $\pm kx$ and cubic term $\mp x^3$ which is weighted by an adjustable attenuator $RL_3$ to provide an output signal of a form c' or d', similar to curve c or curve d in FIG. 1, depending on the position of switch $SW_1$.

The weighted term $\mp x^2$ is available from attenuator $RL_2$ as an alternate output signal $d_1'$ or $c_1'$ respectively similar to curve $d_1$ or curve $c_1$ of FIG. 2B. A switch $SW_2$ selects either of these output signals as the corrective signal y.

We claim:

1. In a message-transmitting system using frequency modulation, in combination:

a crystal-controlled oscillator generating a carrier of a frequency subject to temperature-dependent fluctuations;

a frequency modulator having a first input for receiving a subcarrier and a second input for receiving a message signal to be modulated upon said subcarrier;

a function generator in the vicinity of said oscillator emitting a corrective signal of a magnitude varying as a function of temperature related to the temperature dependence of said fluctuations;

summing means connected to said function generator and to a source of said message signal for supplying the latter together with said corrective signal to said second input whereby said subcarrier is frequency-modulated by the sum of said message and corrective signals;

mixer means with input connections to said oscillator and to said modulator for heterodyning said carrier with the frequency-modulated subcarrier to produce a pair of sidebands respectively representing the sum and the difference of said carrier and subcarrier, the temperature-dependent fluctuations of said carrier being substantially compensated by the corrective modulation of said subcarrier in one of said sidebands; and filter means downstream of said mixer means for suppressing the other of said sidebands.

2. The combination defined in claim 1 wherein said function generator comprises temperature-dependent impedance means connected across a supply of reference voltage for producing a basic signal, multiplication means connected to said impedance means for emitting an exponential function of said basic signal, and adjustable circuit means coupled to said multiplication means for deriving said corrective signal from said exponential function.

3. The combination defined in claim 2 wherein said oscillator includes an AT-cut crystal as a frequency-controlling element, said multiplication means emitting a cubic function of said basic signal, said circuit means comprising an adder connected to said multiplication means and to said impedance means for generating said corrective signal as a polynomial function of said basic signal including a cubic term and a linear term.

4. The combination defined in claim 2 wherein said oscillator includes a C-cut crystal as a frequency-controlling element, said multiplication means emitting a quadratic function of said basic signal, said circuit means comprising amplitude-adjusting means connected to receive said quadratic signal.

5. The combination defined in claim 2 wherein said multiplication means comprises a plurality of cascaded stages emitting respective terms of a polynomial function of said basic signal, said circuit means including amplitude-adjusting means for assigning selected coefficients to said terms and switch means for the selective extraction of certain of said terms weighted by the assigned coefficients to form said corrective signal.

6. The combination defined in claim 2, 3, 4 or 5 wherein said circuit means includes polarity-reversing means for selectively compensating said fluctuations in either one of said sidebands.

7. The combination defined in claim 2, 3, 4 and 5 wherein said impedance means comprises a resistance bridge with two thermistors in opposite arms thereof.

* * * * *